(12) United States Patent
Lu

(10) Patent No.: US 7,023,089 B1
(45) Date of Patent: Apr. 4, 2006

(54) LOW TEMPERATURE PACKAGING APPARATUS AND METHOD

(75) Inventor: Daoqiang Lu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/814,212

(22) Filed: Mar. 31, 2004

(51) Int. Cl.
*H01L 23/10* (2006.01)
*H01L 23/34* (2006.01)
*H01L 23/48* (2006.01)
*H05K 7/20* (2006.01)

(52) U.S. Cl. .................. 257/751; 257/705; 257/706; 257/750; 438/627; 438/628; 361/701; 361/702; 361/709

(58) Field of Classification Search .............. 257/706, 257/707, 783, 750, 751, 761–763, 675, 712, 257/713, 717, 720, 796, E21.021, E21.584, 257/E29.157; 438/122, 627, 628, 643, 653, 438/121; 361/687, 688, 701, 702, 709
See application file for complete search history.

(56) References Cited

U.S. PATENT DOCUMENTS

| | | | | |
|---|---|---|---|---|
| 3,678,570 A | * | 7/1972 | Paulonis et al. | 228/194 |
| 4,700,881 A | * | 10/1987 | Ryan | 228/194 |
| 5,038,996 A | * | 8/1991 | Wilcox et al. | 228/121 |
| 5,242,099 A | * | 9/1993 | Ueda | 228/123.1 |
| 6,519,154 B1 | * | 2/2003 | Chiu | 361/704 |
| 6,597,575 B1 | * | 7/2003 | Matayabas et al. | 361/705 |
| 6,751,099 B1 | * | 6/2004 | Vrtis et al. | 361/705 |
| 6,909,176 B1 | * | 6/2005 | Wang et al. | 257/706 |
| 2004/0050912 A1 | * | 3/2004 | Spencer | 228/194 |

OTHER PUBLICATIONS

Kulojarvi, Kari and Kivilahti, Jorma K., IEEE Transactions On Components, Packaging, And Manufacturing Technology—Part A, "A Low Temperature Interconnection Method for Electronics Assembly", vol. 21, No. 2, Jun. 1998, pp. 288-291.
MacDonald W.D. and Edgar, T.W., Ann. Rev. Mater. Sci. 1992. 22:23-46, "Transient Liquid Phase Bonding", vol. 22:23-46, (1992).
Roman, John W. and Eagar, Thomas W., The International Society for Hybrid Microelectronics (ISHM) Symposium Proceedings, Oct. 1992, Low Stress Die Attach by Low Temperatur Transient Liquid Phase Bonding, Methods in Cell Biology, ISHM, pp. 1-6.

* cited by examiner

*Primary Examiner*—Jasmine Clark
(74) *Attorney, Agent, or Firm*—Troutman Sanders LLP; John M. Briski; James Hunt Yancey, Jr.

(57) ABSTRACT

Some embodiments disclose a low temperature semiconductor packaging apparatus and method. An apparatus generally comprises a heat spreader, a silicon die, and a thermal interface material disposed between the heat spreader and the silicon die comprising a plurality of metals capable of forming a transient liquid phase bond. A method generally comprises attaching a silicon die to a substrate, depositing a thermal interface material on at least one of the silicon die and a heat spreader, and attaching the heat spreader to the silicon die, wherein the thermal interface material comprises a plurality of metals capable of forming a transient liquid phase bond. Other embodiments are also described and claimed.

35 Claims, 4 Drawing Sheets

LOW TEMPERATURE PACKAGING APPARATUS AND METHOD

BACKGROUND

Electronic devices are everywhere in our society. These devices are used in most every facet of human life and range from communication devices to entertainment devices to medical devices. As consumer demand for electronic devices continues to grow at exponential rates, the desire for smaller, faster, and more functional devices also increases. As these desires continually increase, electronic device manufacturers must keep pace with market demands and create new electronic components and manufacturing techniques to satisfy these desires.

Electronic component manufacturers must consider a myriad of factors when designing electronic components, implementing new component designs, and determining how to manufacture new electronic components. Such factors include tooling costs, environmental concerns associated with manufacturing techniques and materials, and minimizing the impact to existing manufacturing processes when adapting these processes to manufacture new electronic devices and the components within those devices. Another factor includes ensuring that the manufacturing process does not critically damage the materials used to create electronic devices. While these factors may present problems to semiconductor package manufacturers, other problems are also associated with current semiconductor packaging processes.

One problem often associated with current semiconductor packaging techniques is the high processing temperature requirement. The high temperature is needed to ensure that the individual components of a semiconductor package are effectively bonded. The high processing temperature requirement may also necessitate utilzation of certain soldering methods that may be undesirable in certain semiconductor manufacturing processes. Additionally, the high processing temperature may introduce high internal stress in the semiconductor package. This high intenal stress may be generated by the varying coefficients of thermal expansion (CTE) for the different materials in the semiconductor package. For example, a silicon die and a copper heat spreader have siginficantly different CTEs, and when bonded together at an elevated temperature, an internal stress may be generated between these materials because the die and heat spreader may contract and/or expand at different rates. Other problems often associated with current manufacturing processes include potentially damaging the semiconductor package components due to the required high processing temperature and manufacturing semiconductor packages in an undesired order to ensure that the high processing temperature does not damage the internal integrity or operating characteristics of a semiconductor package.

DETAILED DESCRIPTION

The various embodiments of the present invention disclose a semiconductor package apparatus and a method for assembling the semiconductor package apparatus. The various embodiments may utilize a plurality of metals to form a thermal interface material ("TIM") for bonding or attaching a heat spreader to a silicon die. The TIM may be a thermal energy conductor and may enable the various embodiments of the present invention to transfer heat from the silicon die to the heat spreader for effective heat dissipation. Additionally, in some embodiments of the present invention, the heat spreader and the silicon die may have different physical properties, including coefficients of thermal expansion (CTE) and contraction rates, and the TIM may enable the heat spreader and silicon die to expand and contract at different rates without degrading the physical structure, thermal properties, and electrical properties of a semiconductor package.

The metals forming the TIM may be chosen according to their physical properties and may form a high temperature resistant TIM bond utilizing a transient liquid phase bonding process at a low bonding temperature. A transient liquid phase bond may be formed by placing an intermediate metal layer (or interlayer) between two base metals. When the two base metals make contact with an interlayer at an elevated bonding temperature, a liquid phase may be formed at the interface between the two base metals and the interlayer. The liquid phase bond may form when the melting point of the interlayer has been exceeded or because the reaction between the base metal and interlayer may result in an alloy with a lower melting point. In some embodiments, this alloy may be a eutectic alloy, which is an alloy having a melting point that is lower than any other alloy composed of the same metals. During the transient liquid phase bonding process, the interlayer may diffuse into the base metals resulting in isothermal solidification. When the bond is cooled, no trace of the liquid phase remains and the formed TIM joint may withstand significantly higher temperatures than the bonding temperature. Some embodiments of the present invention may utilize a plurality of metals to form the TIM to bond a heat spreader and a silicon die together.

Figure 1:
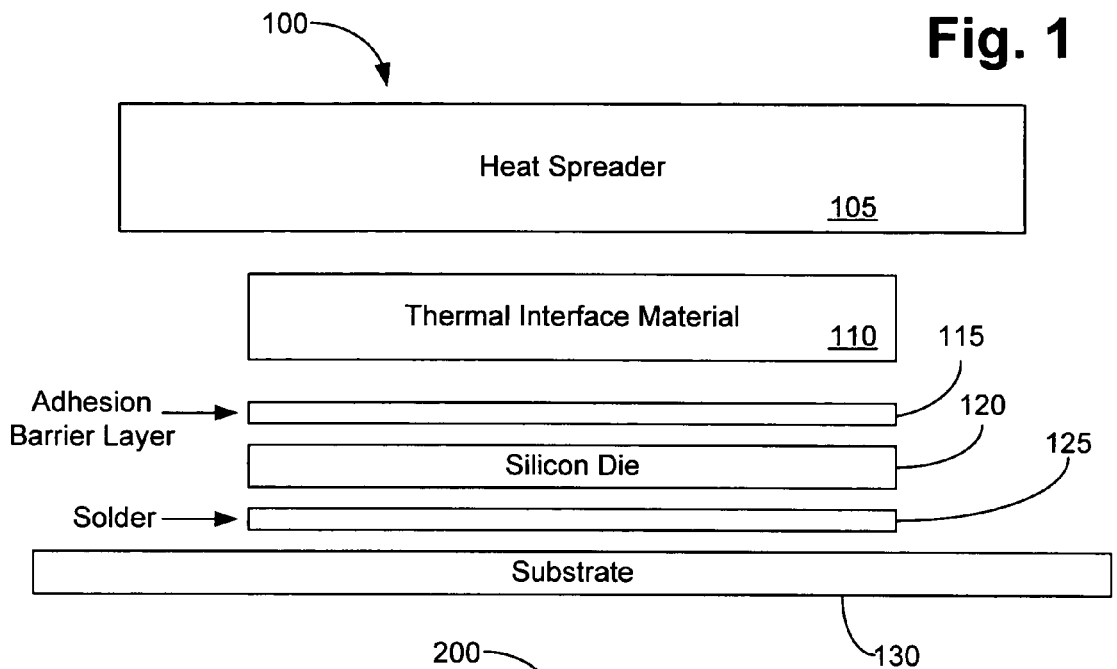
FIG. 1 depicts a cross-sectional exploded view of a semiconductor package apparatus utilized in some embodiments of the present invention.

Referring now to the figures wherein exemplary embodiments of the present invention are illustrated. The figures are not drawn to scale and some items in the drawings may appear larger or smaller so that the various embodiments of the present invention can be fully described. FIG. 1 depicts a cross-sectional view of an embodiment of a semiconductor package apparatus 100 utilized in some embodiments of the present invention. The semiconductor package apparatus 100 may comprise a heat spreader 105, a thermal interface material ("TIM") 110, a silicon die 120, and a substrate 130. The apparatus 100 may also contain an adhesion barrier material (or adhesion barrier layer) 115 to bond the TIM 110 to the silicon die 120, a solder material 125 to electrically connect or bond the silicon die 120 and the substrate 130, and an underfill material (not shown) to reinforce bond between the silicon die 120 and the substrate 130. The heat spreader 105 may be any material capable of dissipating heat from the interior of the apparatus 100 to the exterior of apparatus. For example, the heat spreader 105 may comprise any metal including copper, black diamond, or black diamond copper composite. The heat spreader 105 may also comprise other metals, metaloids, metal alloys, ceramics, composite materials, or any other materials that are capable of dissipating heat without departing from the scope of the present invention. The physical properties, including size, shape, and thickness, of the heat spreader 105 may vary according to implementation and application and are not limited to any particular configuration. Those skilled in the art will appreciate that the physical properties of the heat spreader 105 may vary according to the environment and applicatoin of the semiconductor package device 100 without affecting the scope of the present invention. As mentioned above, the heat spreader 105 may generally have different thermal expansion and contraction rates as compared to the silicon die 120, so the TIM 110 may be disposed between the heat spreader 105 and silicon die 120, and the elastic properties of the TIM 110 may enable these varying rates to occur while not damaging the apparatus 100, heat spreader 105, or the silicon die 120. Additionally, the stress generated between the silicon die 120 and the heat spreader 105 due to their varying CTE rates may be reduced by utilizing the TIM 110 and the low temperature bonding process in the various embodiments of the present invention.

The silicon die 120 utilized in the various embodiments of the present invention may have varying properties. For example, in some embodiments of the present invention the silicon die 120 may have a thickness in the range of approximately 50 microns to approximately 200 microns. This feature may enable a semiconductor package to be small, lightweight, and energy efficient while effectively dissipating thermal energy. Other die thicknesses may also be possible and may be used in assembling a semiconductor package according to other embodiments of the present invention. Additionally, the silicon die 120 used with some embodiments of the present invention may have varying surface areas wherein some embodiments of the present invention utilize larger silicon dies and other embodiments may utilize smaller silicon dies. Although the die 120 is discussed as being a silicon die, die 120 may also be manufactured with other semiconductor materials.

The seimiconductor package apparatus 100 may also comprise a solder material 125 for attaching the silicon die 120 to the substrate 130. The solder material 125 may be any electrically conductive material capable of attaching the silicon die 120 to the substrate 130, and the solder material may be deposited in the form of solder joints. The solder material 125 may comprise tin (Sn) and silver (Ag), but other materials, such as copper (Cu) may also be utilized in the various embodiments of the present invention. Additionally, in some emobiments, the solder joints may be eutectic alloys including SnPb, SnAg, SnAgCu, SnIn, SnCu, or the like. In other embodiments, the solder material 125 may provide electrical contacts for vias (not shown) in the substrate 130. Some embodiments of the present invention may also be utilize ball grid array soldering techniques or may utilize build-up layers. Build-up layers are built up around the silicon die rather than being separately manufactured and bonded to the silicon die with solder bumps. The substrate 130 may be any conventional substrate used to package semiconductors or may also be a substrate used in accordance with build-up layers.

The TIM 110 may comprise a plurality of metals capable of forming a eutectic alloy through a transient liquid phase bond. For example, the TIM 110 may comprise bismuth (Bi), lead (Pb), tin (Sn), indium (In), silver (Ag), gold (Au), or cadmium (Cd). Any combination of these metals may be used in accordance with the various embodiments of the present invention. In some embodiments, the TIM 110 may contain a combination of Sn and Bi, and the amount of Sn may be greater than the quantity of Bi so that the Bi molecules become dispersed in the Sn matrix. The TIM 110 may be formed so that the metals diffuse together or otherwise form a eutectic alloy.

The metals in the TIM 110 may be applied or deposited onto the heat spreader 105, the silicon die 120, or both. For example, in an embodiment of the present invention, a layer of Sn may be deposited on both the heat spreader 105 and the silicon die 120. The thickness of the Sn layer may range from approximately 2 microns to approximately 50 microns. Next, a layer of Bi may be deposited on top of the Sn layer on both the heat spreader 105 and the silicon die 120. The layer of Bi may be much thinner than the layer of Sn in accordance with liquid phase bonding. For example, the Bi layer may be have a thickness in the range of approximately 0.1 microns to approximately 1 micron. Other thicknesses of metals may also be used in other embodiments so long as the thickness of the metals does not detract from the thermal or elastic properties of the TIM 110. In alternative embodiments, the TIM metals may only be applied or deposited onto the heat spreader 105 or the silicon die 120.

In some instances, an adhesion barrier layer 115 may be required to adequately bond the a base metal (e.g., the Sn layer) of the TIM 110 to the silicon die 120. The adhesion barrier material 115 may comprise any material capable of strengthening the bond between the TIM 110 and the silicon die 120 or adhering the TIM 110 and the silicon die 120 together. The adhesion barrier 115 material may also prevent the TIM from diffusing into the silicon die 120. The adhesion barrier material 115 may also improve the thermal or elastic properties of the silicon and tin junction in some embodiments of the present invention. As an example, the adhesion barrier material 115 may include titanium (Ti), chromium (Cr), titanium-nitride (TiN), tantalum (Ta), and tantalum nitride (TaN).

Figure 2:
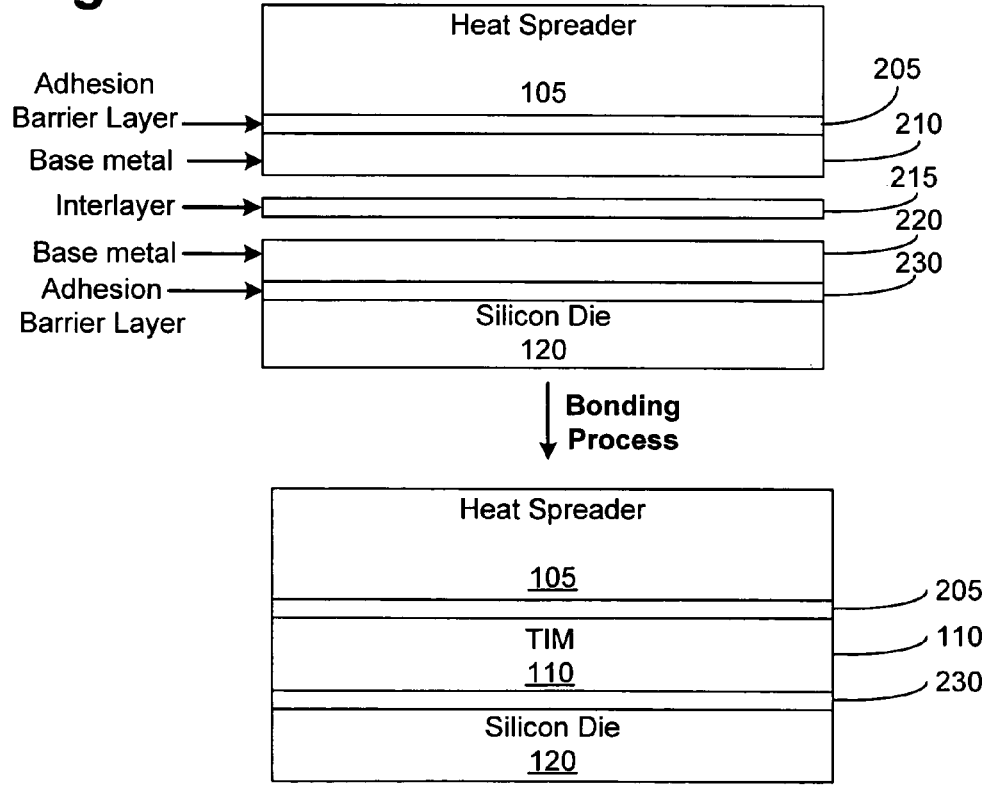
FIG. 2 depicts a cross-sectional view of a metal layer stack that may be utlized in accordance with some embodiments of the present invention.

FIG. 2 depicts a cross-sectional view of a metal layer stack 200 that may be utlized in accordance with some embodiments of the present invention to form the TIM layer 110 between the heat spreader 105 and the silicon die 120. The metal layer stack 200 is shown before bonding has occurred with the different metal layers that may be used according to some embodiments of the invention, and the metal stack 200 is also shown after bonding yields the TIM 110 disposed between the heat spreader 105 and the silicon die 120. Before bonding, the metal layer stack 200 generally include a heat spreader 105, a first base metal 210, an interlayer metal or metal alloy 215, and a second base metal 220. The metal layer stack 200 may also comprise adhesion barrier layers 205, 230. When heated to a predetermined bonding temperature, the interlayer metal 215 may liquify and diffuse into the base metal layers 210, 220. After a predetermined time period, the liquid interlayer 215 may diffuse completely into the base metals 210, 220 such that the two base metals 210, 220 bond together to form the TIM layer 110. In some embodiments, the TIM layer 110 may withstand temperatures which are much higher than the initial bonding temperature.

The base metal layers 210, 220 and the interlayer 215 may comprise various metals. The base metal may be selected from tin (Sn), nickel (Ni), copper (Cu), silver (Ag), gold (Au), and the like. The thickness of the base metal layer may be in the range of approximately two (2) to approximately fifty (50) microns. The base metal layers may be deposited utlizing standard deposition techniques such as electroless and electrolytical plating, CVD, sputtering, and the like. The interlayer 215 may diffuse quickly into the base metal layers 210, 220 during the bonding process and may be dispersed or diffused within the base metal layers 210, 220 after bonding. The thickness of interlayer 215 may range from approximately 0.1 to approximately 5 microns. The interlayer 215 may be an alloy or may be a pure metal such as bismuth (Bi) which may react with the base metal layers 210, 220 to form a low melting point alloy at a predetermined bonding temperature. In some embodiments, the interlayer may be a low melting point pure metal or alloy which may comprise lead (Pb), tin (Sn), indium (In), silver (Ag), gold (Au), or cadmium (Cd). Any combination of these metals may be used in accordance with the various embodiments of the present invention. The interlayer 215 may be deposited on the base metal 210 attached on the heat spreader 105, the base metal layer 220 attached on the silicon die 120, or both. The interlayer 215 may be deposited using sputtering, plating, CVD, and the like.

In some embodiments, adhesion barrier layers 205, 230 may be required to adequately bond the the base metal layers 210, 220 (e.g., the Sn layer) to the heat spreader 105 and/or the silicon die 120. The adhesion barrier layers 205, 230 may comprise any material capable of strengthening the bond between the base metal layers 210, 220, and the heat spreader 105 and/or the silicon die 120. Additioanlly, the adhesion barrier layers 205, 230 may also prevent inter-diffusion of molecules between the base metals 210, 220 and the heat spreader 105 interface and/or the base metals 210, 220 and the silicon die 120 interface. The adhesion barrier layers 205, 230 may include titanium (Ti), chromium (Cr), titanium-nitride (TiN), tantalum (Ta), tantalum nitride (TaN), or the like. The adhesion barrier layers 205, 230 may be applied or deposited onto the heat spreader 105 and the silicon die 120 using standard deposition techniques such as chemical vapor deposition (CVD), sputtering, and the like.

The TIM layer 110 may be formed by bonding the two base metal layers 210, 220, and the interlayer 215 at a relatively low predetermined bonding temperature. In some embodiments, the interlayer 215 may be applied on both base metal layers 210, 220 while in other embodiments, the interlayer 215 may only be applied to one of the base metal layers 210, 220. At the predetermined bonding temperature, the interlayer 215 may melt or react with the base metal layers 210, 220 to form a low melting point alloy. In some embodiments, the formed alloy may be a eutectic alloy. The interlayer 215 may also diffuse into the base metal layers 210, 220 during the bonding process. As the interlayer 215 diffuses into the base metal layers 210, 220, the two base metal layers 210, 220 bond together to form the TIM 110. In some embodiments, the base metal layers 210, 220 may be tin (Sn) layers and interlayer 215 may be bismuth (Bi), where the quantity of Sn contained in the base metal layers 210, 220 may be greater than the quantity of Bi contained in the interlayer 215. During the bonding process, a liquid phase bond may form when the Bi—Sn metal stack 200 is heated to a predetermined bonding temperature of approximately 160 degrees Celsisus. At this temperature, the Bi atoms may diffuse into the Sn matrix. After the bonding process, the formed Sn—Bi TIM may have a melting point close the melting point of pure Sn (i.e., approximately 232 degrees Celsius), which is higher than the predetermined bonding temperature.

Figure 3:
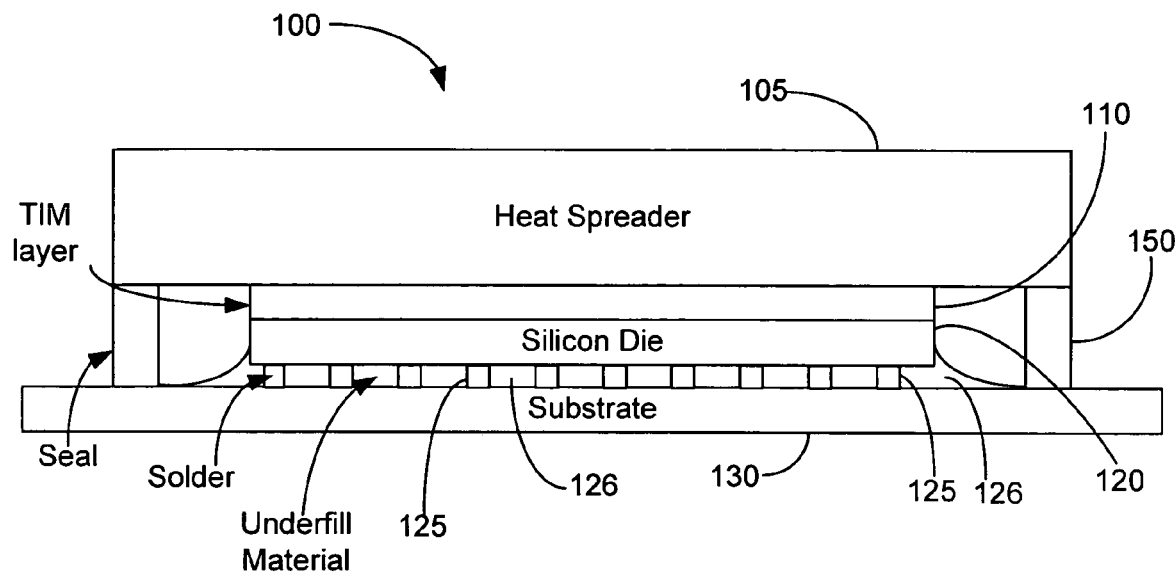
FIG. 3 depicts a cross-sectional view of an assembled semiconductor package appartus in accordance with some embodiments of the present invention.

FIG. 3 depicts a cross-sectional view of the assembled semiconductor package appartus 100 after it has been sealed in accordance with some embodiments of the present invention. The assembled semiconductor package apparatus 100 generally comprises a heat spreader 105, a TIM 110, and a silicon die 120. The apparatus 100 may also include a plurality of solder junctions 125, underfill material 126, substrate 130, and a seal 150. The TIM 110 may bond the heat spreader 105 and the silicon die 120 together and the solder junctions 125 may bond the silicon die 120 and the substrate 130 together. The seal 150 may be any sealant capable of being inserted or disposed between the heat spreader 105 and the substrate 130 to protect and encapsulate the silicon die 120 and the TIM 110. The seal 150 may be formed with any material capable of enclosing the TIM 110 and the silicon die 120 and may be a silicone-based sealing material. As an example, in some embodiments, the sealant may be a silicone-based adhesive. Other sealants may also be utilized with some embodiments of the invention. Apparatus 100 may also comprise an adhesion barrier material (not shown) between the heat spreader 305 and the TIM 110 and/or the TIM 110 and the silicon die 120. Although, apparatus 100 is shown as a stand alone package, semiconductor package apparatus 100 may also be utilized in various system embodiments.

Figure 4:
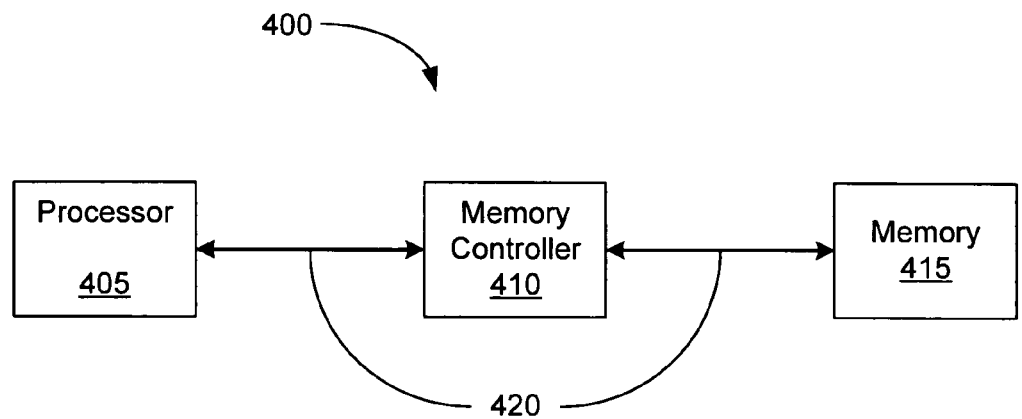
FIG. 4 depicts a system embodiment utilizing some embodiments of the present invention.

FIG. 4 depicts a system 400 that may utilize the semiconductor packagae apparatus 100. System 400 may generally comprise a processor 405 and a data bus 420. The processor 405 may incorporate the semiconductor package apparatus 100, such that a microprocessor may be embedded in the silicon die of the semiconductor package apparatus 100. In this manner, the heat spreader 105 may dissipate the heat generated by the processor 405. The processor 405 may be connected to an input/output device with the data bus 420 coupling the processor 405 to at least one input/output device. The data bus 420 may be any medium capable of providing a path for electronic signals, and may be a serial or parallel data bus. The input/output devices of system 400 may include a memory controller 410, at least one memory 415, or any input/output data device. The memory controller 410 may be capable of controlling data flow to and from a plurality of memories and may also control the flow of data across the data bus 420. The memory 415 may comprise a single memory or a plurality of memories and may also comprise various memory types including volatile or non-volatile memory. Although, processor 405 may comprise various embodiments of the present invention, other system components may also comprise some embodiments of the present invention. For example, the memory controller 410, the memory 415, or both may also be designed and manufactured according to the various embodiments of the present invention. Other semiconductor packages including other data devices may also be packaged using the various methods of assembling a semiconductor package according to the present invention. Although the system 400 has been described in terms of a processor and memory, those skilled in the art will appreciate that the system may incorporate any semiconductor device in which heat is requried to be dissipated, without departing from the scope of the invnention.

Figure 5:
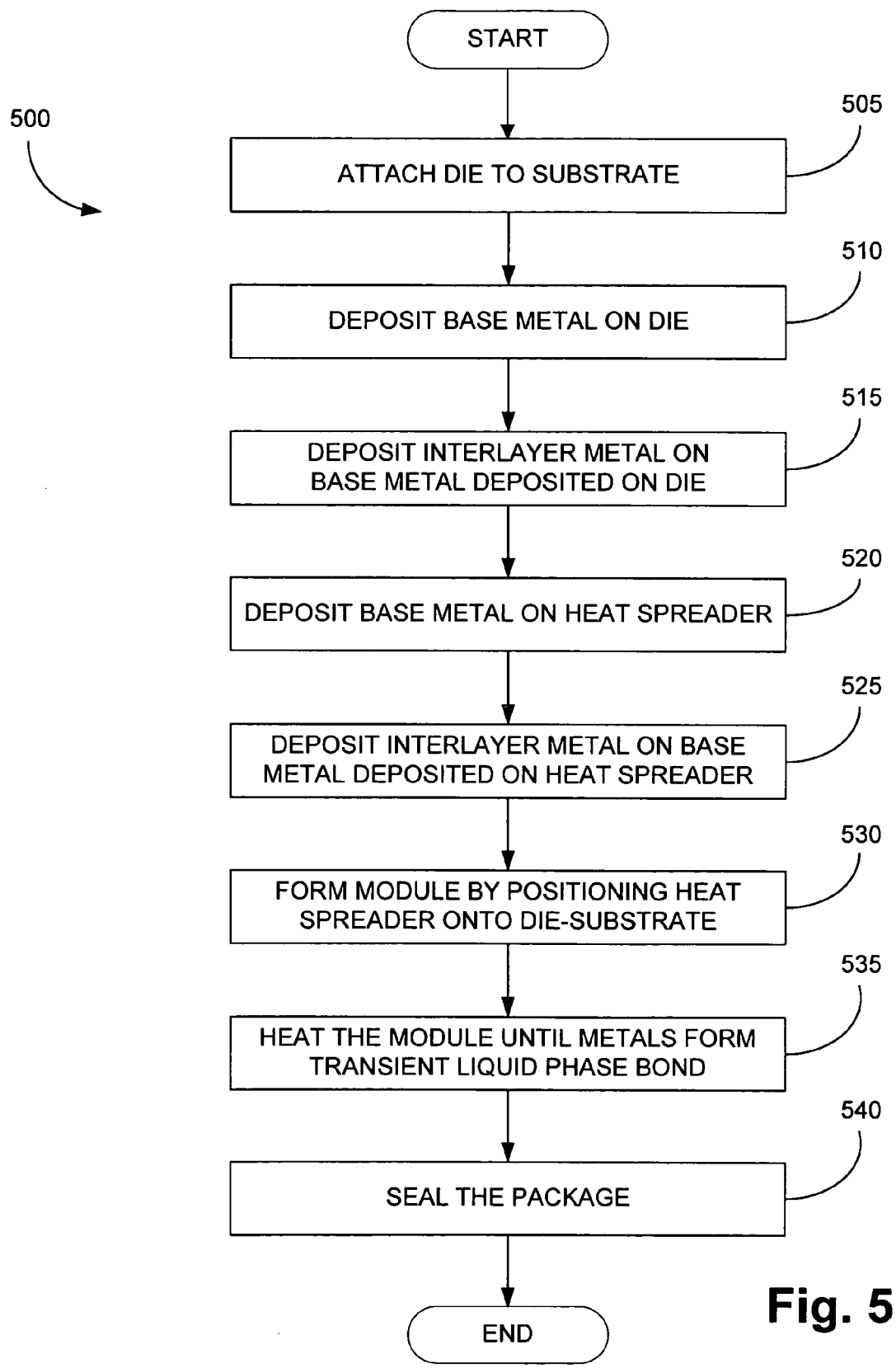
FIG. 5 depicts a logic flow diagram illustrating a method of assembling a semiconductor package according to some embodiments of the present invention.

FIG. 5 depicts a logic flow diagram illustrating a method 500 of assembling a semiconductor package according to some embodiments of the present invention. Method 500 generally includes attaching a silicon die 120 to a substrate 130, depositing a TIM on at least one of the heat spreader 105 and the silicon die 120, and attaching the heat spreader 105 to the die 120. The thermal interface material may contain a plurality of metal layers including a base metal layer and an interlayer. Also in some embodiments, an adhesion barrier layer may be deposited between the heat spreader 105 and the TIM 110 and/or the TIM 110 and the silicon die 120. Method 500 begins at 505, in which a silicon die 120 may be attached to a substrate 130 using various techniques including a no-flow soldering process or a soldering process that utilizes a flux and a capillary underfill. Next at 510, a base metal, such as Sn, may be deposited on the silicon die 120. Next at 515, an interlayer metal, such as Bi, may be deposited onto the Sn deposited onto the silicon die 120. At 520, a base metal, such as Sn, may be deposited on the heat spreader 105, and at 525, an interlayer metal, such as Bi, may be deposited onto the Sn deposited onto the heat spreader 105.

The metal layers forming the TIM may be deposited using any deposition or application techniques and the metal amounts may vary. In one embodiment of the present invention, a base metal layer of Sn having a thickness ranging from approximately two (2) microns to approximately three (3) microns may be first applied to the silicon die 120, the heat spreader 105, or both. Next, an interlayer of Bi having a thickness ranging from approximately 0.1 microns to approximately 0.3 microns may be applied onto the layer of Sn on the silicon die 120, the heat spreader 115, or both. In alternative embodiments, other thicknesses may be used for the Sn and Bi layers. For example, the Sn layer may have a thickness in the range of approximately 2 microns to approximately 50 microns and a Bi layer may have a thickness in the range of approximately 0.1 microns to approximately 1 micron. The TIM 110 may also be formed with any number of metal layers and/or a low melting point alloy. For example indium (In) may be first applied to the heat spreader 105 and the silicon die 120 and a silver (Ag) layer may be applied onto the In layers. The In—Ag transient liquid phase bond may be formed at approximately 150 degrees Celsisus to approximately 170 degrees Celsisus, and the resulting TIM may be capable of withstanding higher temperatures such as approximately 500 degrees Celsisus. Those skilled in the art will appreciate that any number of layering processes may be used to form the TIM without departing from the spirit and scope of the various claimed embodiments of the present invention.

Other metals having other thicknesses may also be used according to the various embodiments of the present invention. The various metals forming the TIM may cause the TIM layer to have varying thicknesses in some embodiments of the present invention. In other embodiments, the TIM may have a thickness in the range of approximately one (1) micron to approximately one-hundred (100) microns. This feature of the some embodiments may provide a TIM that may conduct thermal energy for dissipating heat between the silicon die 120 and the heat spreader 105. Other thicknesses may also be used to form the TIM 110, and other materials may also be used according to method 500.

At 530, a semiconductor package module may be formed by positioning or aligning the heat spreader 105 onto the silicon die 120. At 535, the semiconductor package module may be heated to a predetermined bonding temperature and kept at that temperature for a predetermined bonding time until the TIM metals form a transient liquid phase bond. The bonding temperature and the bonding time are highly dependent on the base metal and interlayer stacks. In some embodiments, the predetermined bonding temperature may be approximately 160 degrees Celsius, while in other embodiments the predetermined bonding temperature may be approximately 100 degrees Celsius to approximately 200 degrees Celsius. In some embodiments, the bonding time may be only approximately one hour, while in other embodiments, the bonding time may be as long as approximately 24 hours. As mentioned above, the temperature at which the TIM metals bond to form the TIM may be lower than the melting points of the individual metals. This feature of the various embodiments of the present invention enables the TIM to be formed at a temperature lower than the temperature at which the TIM would re-melt. For example, some embodiments of the present invention, the TIM may comprise Sn and Bi. The melting point of Sn is approximately 232 degrees Celsius and the melting point of Bi is approximately 271 degrees Celsius. A TIM comprised of these metals, however, may have a melting point of approximately 160 degrees Celsius which is lower than the melting points of each the individual metals. Additionally, once the Sn and Bi form the TIM layer 110 and the interlayer Bi has diffused into the Sn matrix, the Sn—Bi TIM re-melting temperature may be higher than the initial bonding temperarature of approximately 160 degrees Celsius and closer to the melting point of Sn. Finally at 540, the semiconductor package module may be sealed by disposing a sealing material between the heat spreader 105 and the substrate 130, inserting an expandable sealing material between the heat spreader 105 and the substrate 130, or the like.

The TIM metals must be heated at a temperature for an amount of time that allows the TIM metals to effectively diffuse into one another. In an embodiment of the present invention, the TIM metals may be heated at approximately 160 degrees Celsius for approximately one hour. Alternatively in other embodiments of the present invention, the TIM metals may be heated in a range of approximately 100 degrees Celsius to approximately 200 degrees Celsius. Additionally, in some embodiments, the TIM may be heated for amounts of time ranging from approximately one hour to several hours. The exact heating time may depend on the metals comprising the TIM and if the TIM metals have been placed only on one or both of the heat spreader 105 and silicon die 120. In some embodiments, the TIM metals may be heated at several different temperatures for various times. For example in some embodiments, the TIM metals may be heated to 175 degrees Celsius for one hour and then at 140 degrees Celsius for four hours. Those skilled in the art will appreciate that the temperature range and heating times for forming the TIM will vary according to the TIM metals utilized and that the above discussed exemplary embodiments do not represent the full range of heating temperatures and times.

Adhesion barrier layers 205, 230 may also be used in some embodiments of the present invention. In one embodiment, an adhesion barrier layer 230 may be deposited onto the silicon die 120 before the TIM metals are deposited. The adhesion barrier layer 230 may create a stronger bond between the silicon die 120 and the base metals. An adhesion barrier layer 230 may include a metal selected from the group consisting of Ti, Cr, TiN, Ta, TaN, and the like. Other metals or materials may also be used to form an adhesion barrier material 230 that may be disposed between the TIM 110 and the silicon die 120. In other embodiments, an adhesion barrier layer 205 may also be deposited on the heat spreader 105 to bond the heat spreader 105 and the TIM 110. This adhesion barrier material 205 may comprise a metal selected from the group consisting of Ti, Cr, TiN Ta, TaN, and the like. Other metals or materials may also be used to form an adhesion material 205 that may be disposed between the TIM 110 and the heat spreader 105.

Figure 6:
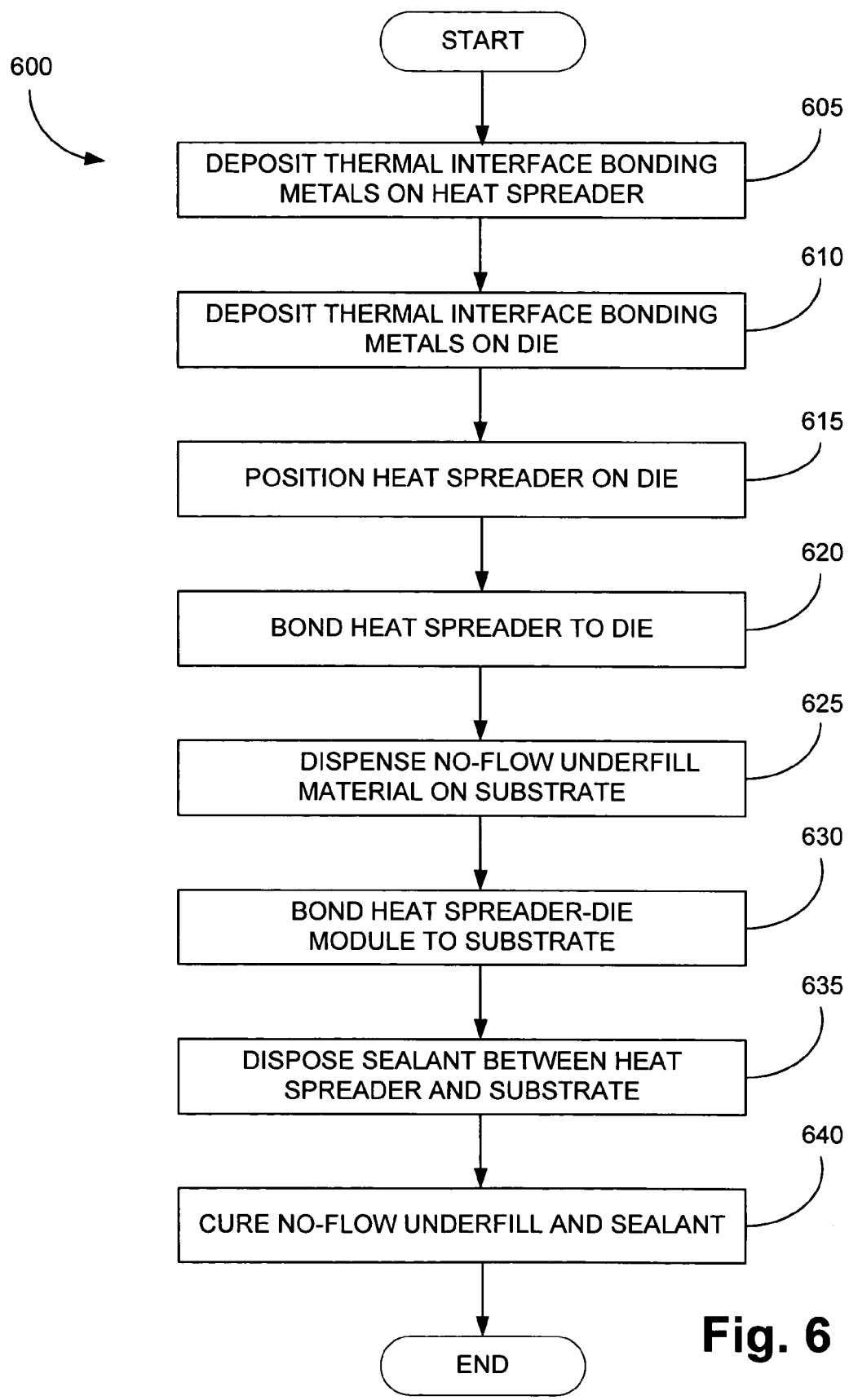
FIG. 6 depicts a logic flow diagram illustrating another method of assembling a semiconductor package according to some embodiments of the present invention.

FIG. 6 depicts a logic flow diagram illustrating another method 600 of assembling a semiconductor package according to some embodiments of the present invention. Method 600 begins at 605, where TIM metals may be deposited onto a heat spreader 105. At 610, TIM metals may be deposited on a silicon die 120. In some embodiments, the TIM metals may contain a base layer and an interlayer, and some embodiments may also utilize an adhesion barrier layer that may be deposited onto the heat spreader 105 and/or the silicon die 120. Next at 615, the heat spreader 105 may be positioned and aligned onto the silicon die 120. Then at 620, the heat spreader 105 may be bonded to the silicon die 120 to form a heat spreader-die module. At 625, a no-flow underfill 126 may be dispesned on the substrate 130. Next, at 630, the heat spreader-die module may then be attached to a substrate 130 using a thermocompression bonding technique to form a package module. Some embodiments may use other bonding techniques. At 635, a sealant 150 may be inseterted or disposed between the heat spreader and the substrate. In some embodiments, the sealant 150 may encapsulate the die and the thermal interface material to protect these items from the surrounding environment. At 640, the semiconductor package apparatus may be sealed by curing the sealant 150 and the no-flow underfill. This method 600 may enable the silicon die 120 and the heat spreader 105 to be bonded together utilizing the TIM before the substrate 130 is bonded to the silicon die 120. Those skilled in the art will appreciate that methods 500 and 600 may be performed in various orders without departing from the scope and spirit of the appended claims.

While the various embodiments of the present invention have been discussed above, the present invention is not so limited and other alternative embodiments will become apparent to those skilled in the art to which an exemplary embodiment pertains without departing from its spirit and scope. Accordingly, the scope of the present invention is defined by the appended claims and their full range of equivalents rather than the foregoing exemplary embodiments and description.

I claim:

1. An apparatus comprising:
a hear spreader;
a silicon die; and
a thermal interface material (TIM) disposed between the heat spreader and the silicon die comprising a plurality of metals capable of forming a transient liquid phase bond, wherein a first TIM metal is at least partially diffused within a second TIM metal.

2. The apparatus of claim 1 wherein the thermal interface material comprises tin (Sn) and bismuth (Bi).

3. The apparatus of claim 1 further comprising a substrate attached to the silicon die.

4. The apparatus of claim 3 further comprising a seal disposed between the hear spreader and the substrate to encapsulate the thermal interface material and the silicon die.

5. The apparatus of claim 1 further comprising an adhesion barrier material disposed between the silicon die and the thermal interface material.

6. The apparatus of claim 5, wherein the adhesion barrier material comprises a metal selected from the group consisting of titanium (Ti), chromium (Cr), titanium-nitride (TIN), tantalum (Ta), or tantalum-nitride (TaN).

7. The apparatus of claim 1 wherein the heat spreader comprises a metal selected from the group consisting of copper, black diamond, or black diamond copper composite.

8. The apparatus of claim 7 further comprising an adhesion barrier material disposed between the heat spreader and the thermal interface material.

9. The apparatus of claim 8, wherein the adhesion barrier material comprises a metal selected from the group consisting of titanium (Ti), chromium (Cr), titanium-nitride (TiN), tantalum (Ta), or tantalum-nitride (TaN).

10. The apparatus of claim 1, wherein the thermal interface material is comprised of a first metal selected from the group consisting of tin (Sn), nickel (Ni), copper (Cu), silver (Ag), or gold (Au).

11. The apparatus of claim 1, wherein the thermal interface material is comprised of a second metal selected from the group consisting of bismuth (Si), lead (Pb), an (Sn), indium (In), silver (Ag), gold (Au), or cadmium (Cd).

12. The apparatus of claim 1, wherein at least one of the plurality of metals in the thermal interface material is diffused within another metal, wherein the thermal interface material comprises a eutectic alloy.

13. A process comprising:
attaching a silicon die to a substrate;
depositing a thermal interface material on at least one of the silicon die and a heat spreader; and
attaching the heat spreader to the silicon die at a handing temperature, wherein the thermal interface material comprises a plurality of metals capable of forming a transient liquid phase bond, and wherein the bonding temperature is less than the melting temperature of the metals.

14. The process of claim 13 wherein depositing the thermal interface material on at least one of the silicon die and a heat spreader comprises depositing a base metal and an interlayer metal on at least one of the silicon die and a heat spreader.

15. The process of claim 14 wherein attaching the heat spreader to the silicon die comprises heating the thermal interface material to a predetermined bonding temperature such that the plurality of metals diffuses within one another.

16. The process of claim 15 wherein hearing the thermal interface material further comprises selecting the predetermined bonding temperature to range from approximately 100 degrees Celsius to approximately 200 degrees Celsius.

17. The process of claim 14 wherein depositing the base metal further comprises selecting the base metal from the group consisting of tin (Sn), nickel (Ni), copper (Cu), silver (Ag), or gold (Au).

18. The process of claim 14 wherein depositing the interlayer metal further comprises selecting the interlayer metal from the group consisting of bismuth (Bi), lead (Pb), tin (Sn), indium (In), silver (Ag), gold (Au), or cadmium (Cd).

19. The process of claim 13 further comprising depositing an adhesion barrier material on the silicon die prior to depositing the base metal on the heat spreader.

20. The process of claim 13 further comprising depositing an adhesion barrier material on the heat spreader prior to depositing the base metal on the heat spreader.

21. The process of claim 13 further comprising sealing the heat spreader and the substrate together to enclose the silicon die and the thermal interface material.

22. An apparatus comprising:
a heat spreader;
a substrate;
a silicon die attached to the substrate; and
a bonding material that bonds the heat spreader to the silicon die, wherein the bonding material comprises metals capable of forming a transient liquid phase bond, wherein the bonding material has a melting temperature that is lower than the melting point of the metals.

23. The apparatus of claim 22 wherein the heat spreader comprises a metal selected from the group consisting of copper, black diamond, or black diamond copper composite.

24. The apparatus of claim 22 wherein the silicon die has a thickness in the range of approximately 50 microns to approximately 200 microns.

25. The apparatus of claim 22 wherein the bonding material comprises tin (Sn) and bismuth (Bi).

26. The apparatus of claim 22 wherein the bonding material has a thickness in the range of approximately 1 micron to approximately 100 microns.

27. A process comprising:
depositing a first metal on a silicon die and a heat spreader;
depositing a second metal on the first metal;
attaching the silicon die to a substrate; and
bonding the heat spreader to the silicon die, wherein the first and second metals form a transient liquid phase bond when heated for a predetermined time at a predetermined bonding temperature, wherein the bonding temperature is less than the melting temperature of the first and second metals.

28. The process of claim 27 further comprising dispensing a sealant between the substrate and the heat spreader to enclose the silicon die and the transient liquid phase bond.

29. The process of claim 27, wherein depositing the first metal further comprises depositing tin (Sn) having a thickness in the range of approximately 2 microns to approximately 50 microns.

30. The process of claim 27 wherein depositing the second metal further comprises depositing bismuth (Bi) having a thickness in the range of approximately 0.1 microns to approximately 1 micron.

31. The process of claim 27 wherein bonding further comprises selecting the predetermined bonding temperature to range from approximately 30 degrees Celsius to approximately 200 degrees Celsius.

32. The process of claim 27 wherein bonding further comprises selecting the predetermined time to range from approximately one hour to approximately twenty-four hours.

33. A system comprising:
a processor comprising a heat spreader, a silicon die, and a thermal interface material disposed between the heat spreader and the silicon die comprising a plurality of metals capable of forming a transient liquid phase bond, wherein at least one of the plurality of metals in the thermal interface material is diffused within another metal; and
a parallel data bus coupling the processor to at least one input/output device.

34. The system of claim 33 wherein the thermal interface material comprises a metal selected from the group consisting of bismuth (Bi), lead (Pb), tin (Sn), indium (In), silver (Ag), gold (Au), copper (Cu), nickel (Ni), or cadmium (Cd).

35. The system of claim 33 further comprising a volatile memory.

* * * * *

UNITED STATES PATENT AND TRADEMARK OFFICE
CERTIFICATE OF CORRECTION

| | |
|---|---|
| PATENT NO. | : 7,023,089 B1 |
| APPLICATION NO. | : 10/814212 |
| DATED | : April 4, 2006 |
| INVENTOR(S) | : Daoqiang Lu |

It is certified that error appears in the above-identified patent and that said Letters Patent is hereby corrected as shown below:

In Claim 1 (Column 9, Line 37), please replace "hear" with "heat" such that this claim element recites --a heat spreader--.

Signed and Sealed this

Nineteenth Day of September, 2006

JON W. DUDAS
*Director of the United States Patent and Trademark Office*